United States Patent [19]

Ohmer

[11] Patent Number: 5,259,917
[45] Date of Patent: Nov. 9, 1993

[54] TRANSPARENT SEMICONDUCTOR CRYSTALS

[75] Inventor: Melvin C. Ohmer, Dayton, Ohio

[73] Assignee: The United States of America as represented by the Secretary of the Air Force, Washington, D.C.

[21] Appl. No.: 920,699

[22] Filed: Jul. 28, 1992

[51] Int. Cl.$^5$ .............................. C30B 1/04
[52] U.S. Cl. ...................... 156/605; 156/603; 156/620.72; 148/DIG. 165; 437/17
[58] Field of Search .......... 156/600, 603, 605, 620.72, 156/DIG. 77, DIG. 80, DIG. 92; 148/DIG. 165, DIG. 166; 437/17, 19

[56] References Cited

U.S. PATENT DOCUMENTS

| | | | |
|---|---|---|---|
| 3,872,492 | 3/1975 | Robbins | 357/23 |
| 3,933,990 | 1/1976 | Gentile et al. | 423/508 |
| 4,107,564 | 8/1978 | Klimin et al. | 313/94 |
| 4,309,225 | 1/1982 | Fan et al. | 156/DIG. 80 |
| 4,469,551 | 9/1984 | Loude | 156/603 |
| 4,637,864 | 1/1987 | Covino et al. | 204/61 |

Primary Examiner—Olik Chaudhuri
Assistant Examiner—Felisa Garrett
Attorney, Agent, or Firm—Bobby D. Scearce; Thomas L. Kundert

[57] ABSTRACT

A method for producing a semiconductor crystal which is highly transparent in the 1-3 $\mu$ spectral range is described which comprises the steps of exposing the crystal to high energy ionizing gamma radiation to produce within the crystal energetic photo electrons which produces defect donors to cancel acceptors existing in the as-grown crystal.

10 Claims, No Drawings

TRANSPARENT SEMICONDUCTOR CRYSTALS

RIGHTS OF THE GOVERNMENT

The invention described herein may be manufactured and used by or for the Government of the United States for all governmental purposes without the payment of any royalty.

BACKGROUND OF THE INVENTION

The present invention relates to a method for producing semiconductor crystals which are highly transparent in the one to three micron ($\mu$) spectral range.

The method described herein comprises generally the introduction of donors into phosphorus and/or arsenic containing semiconductor compounds for the purpose of changing the transparency or electrical conductivity thereof. Classes of semiconductor compounds to which the invention may have particular application include chalcopyrite structured semiconductors formed of a Group IIB element (from the periodic table of elements column headed by zinc) and a Group IVB element (column headed by carbon) combined with phosphorus and/or arsenic, and the semiconductor compounds formed of a Group IIIB element (column headed by boron) combined with phosphorus and/or arsenic.

A compound of special interest is zinc germanium di-phosphide ($ZnGeP_2$), a ternary chalcopyrite semiconductor, because of its characteristic non-linear optical properties and relatively wide bandgap which render it a prime candidate as a tunable infrared (IR) laser when used in an optical parametric oscillator. However, characteristic lack of transparency in the 1-3 $\mu$ wavelength range of $ZnGeP_2$, as well as of other semiconductors enumerated herein, has severely limited utility in applications requiring short wavelength pump lasers such as a Nd:YAG laser at 1.06 $\mu$ or a Ho:YLF laser at 2.05 $\mu$, or a Tm:Ho:YAG at 2.09 $\mu$, or other lasers running to 2.9 $\mu$, to pump an oscillator.

Single $ZnGeP_2$ crystals of suitable size ($\sim 0.7 \times 0.7 \times 2.0$ cm or larger) for use as IR transmitting non-linear optical elements in the 0.8-12 $\mu$ range may be successfully grown by one or more prior art methods, such as the horizontal or vertical Bridgman methods in which the crystal material is melted in a horizontal boat or a vertical cylindrical vessel which is seeded or tapers conically to a point at the bottom, and the boat or vessel is moved or lowered slowly into a cold zone to initiate crystallization at the seed or in the tip. Alternatively, a dynamic gradient furnace may be utilized in the Bridgman process; in such a furnace, via multiple heating elements, a pre-programmed thermal gradient moves along the axis of the furnace eliminating the requirement to move the vessel or boat. Intrinsic defects in the form of acceptors in the as-grown crystal, however, result in a high resistance p-type form which has a large photo-absorption coefficient of about 4-20 cm$^{-1}$ (i.e. lacks transparency) at 1-3 $\mu$. Successful operation of the oscillator requires the absorption coefficient to be about 0.1 to 0.01 cm$^{-1}$, which is orders of magnitude lower than that of state of the art crystals. Annealing for $\sim 100$ hours at 450°-550° C. was shown to reduce the absorption coefficient in the 1-3 $\mu$ range to about 4 cm$^{-1}$ (Rud et al, Sov Tech Phys Lett 7, 72 (1981)), a yet unacceptably high value. Irradiation by 2 MeV electrons adequate to introduce $10^{17}$-$10^{18}$ cm$^{-3}$ point defects reduces the absorption coefficient in small crystals below 0.1 cm$^{-1}$ (Brudnyi et al, Phys Stat Sol (9) 50, 379 (1979)), but electron beam processing with 1-2 MeV electrons is limited by an inherently short electron penetration depth resulting in a crystal thickness limitation of about 3 mm.

The invention solves or significantly reduces in critical importance problems in the prior art as just described by providing a method for producing semiconductor crystals which are highly transparent in the 1-3 $\mu$ range. A principal feature of the invention resides in exposing a crystal to ionizing radiation to introduce defect donors in the crystal to compensate for acceptors in the as-grown crystal. Penetrating gamma radiation with an energy in excess of $10^6$ electron volts is preferred in order to introduce donors uniformly throughout a large crystal. The gamma radiation produces energetic $10^6$ eV photo electrons which produce point defect donors for cancelling the acceptors. The radiation exposure time required is that which produces $10^{17}$ to $10^{19}$ cm$^{-3}$ donors and a substantially transparent crystal.

The invention may find substantial use in tunable IR laser spectrometers wherein an increase in resolution of several orders of magnitude is provided over that of state of the art spectrometers. Since laser spectrometers produce highly collimated beams over long distances, spectrometry of the atmosphere may be a major application in the quantitative determination of pollution levels and the enforcement of quality standards.

It is therefore a principal object of the invention to provide transparent semiconductor crystals.

It is a further object of the invention to provide a method for producing semiconductor crystals which are highly transparent in the 1-3 $\mu$ spectral range.

It is yet another object of the invention to provide a method for producing transparent semiconductor crystals for use as IR transmitting non-linear optical elements in the 1-3 $\mu$ range.

These and other objects of the invention will become apparent as a detailed description of representative embodiments proceeds.

SUMMARY OF THE INVENTION

In accordance with the foregoing principles and objects of the invention, a method for producing a semiconductor crystal which is highly transparent in the 1-3 $\mu$ spectral range is described which comprises the steps of exposing the crystal to high energy ionizing gamma radiation to produce within the crystal energetic photo electrons which produces defect donors to cancel acceptors existing in the as-grown crystal.

DETAILED DESCRIPTION

In accordance with a principal feature of the invention, crystals of semiconductor compounds produced by prior art methods may be processed as taught herein to substantially improve transparency of the crystals to IR radiation in the 1-3 $\mu$ spectral range. The method of the invention is particularly applicable to phosphorus and/or arsenic containing semiconductor compounds $ZnGeP_2$, $CdGeAs_2$, $ZnGeAs_xP_{1-x}$, $CdGeAs_xP_{1-x}$, $ZnGeAs_2$, $ZnSiAs_2$, $ZnSiP_2$, $CdGeP_2$, $CdSiP_2$, $ZnSiAs_xP_{1-x}$, $CdSiAs_xP_{1-x}$, and $CdSnP_2$ (x equals 0 to 1). In the oriented and shaped as-grown crystal, which may typically be about $5 \times 5 \times 10$ to about $10 \times 10 \times 35$ mm$^3$ in size, intrinsic defects in the form of acceptors are substantially uniformly distributed in the crystal with a density of about $10^{17}$ to $10^{19}$ cm$^{-3}$. The interaction of ionizing charged particle beams (such as alpha or beta particles) with matter differs markedly from that of ionizing electromagnetic radiation (such as gamma or x-ray), especially with respect to penetrating power into the matter. Therefore, in order to introduce sufficient defect donors uniformly throughout the crystal for cancelling the acceptors within the as-grown crystal, and in order to provide a uniformly transparent crystal, high energy penetrating gamma or x-ray is needed to uniformly introduce defect donors in the corresponding density range of about $10^{17}$ to $10^{19}$ cm$^{-3}$. In the practice of the invention, and with attention specifically to a representative compound from the foregoing list, in the treatment of a ZnGeP$_2$ crystal, a preferred source of gamma radiation may typically be cobalt-60 having two characteristic gamma energies at 1.33 and 1.17 MeV. Other usable gamma and x-ray sources may include radioactive isotopes of elements which efficiently emit gammas of MeV energies and x-ray sources capable of emissions of several hundred KeV. Exposure times depend on the concentration of acceptors to be eliminated and on the intensity of the gamma flux. A typical gamma radiation facility used in demonstration of the invention using ZnGeP$_2$ has the following parameters:

| | |
|---|---|
| Co$^{60}$ Source: | 42 kilo-curies; |
| Half-life: | 5.2 years |
| Radiation: | 5 megarads/hr; |
| Nominal photo-electron fluence: | $10^{14}$ electrons/cm$^2$/hr. |

To compensate, the following acceptor concentrations would require the corresponding listed irradiation times:

| Acceptor Concentration | Irradiation Time |
|---|---|
| $1 \times 10^{17}$ cm$^{-3}$ | 6 weeks |
| $5 \times 10^{17}$ cm$^{-3}$ | 30 weeks |
| $1 \times 10^{18}$ cm$^{-3}$ | 60 weeks |

Six months to a year or two is a reasonable processing time. The irradiation produces a substantially transparent crystal.

The invention therefore provides a method for producing a semiconductor crystal which is highly transparent in the 1–3 $\mu$ wavelength range. It is understood that modifications to the invention may be made as might occur to one with skill in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

I claim:

1. A method for producing a semiconductor crystal which is highly transparent in the 1–3 $\mu$ spectral range, comprising the steps of:
   (a) providing a crystal of semiconductor material; and
   (b) exposing said crystal to high energy ionizing radiation to produce within the crystal energetic photo electrons whereby said energetic photo electrons produce defect donors to cancel acceptors existing in said crystal, whereby said crystal is rendered substantially transparent to radiation in the 1–3 $\mu$ spectral range.

2. The method of claim 1 wherein said semiconductor crystal comprises a material selected from the group consisting of ZnGeP$_2$, CdGeAs$_2$, ZnGeAs$_x$P$_{1-x}$, CdGeAs$_x$P$_{1-x}$, ZnGeAs$_2$, ZnSiAs$_2$, AnSiP$_2$, CdGeP$_2$, CdSiP$_2$, ZnSiAs$_x$P$_{1-x}$, CdSiAs$_x$P$_{1-x}$, and CdSnP$_2$.

3. The method of claim 1 wherein said crystal is in the size range of about $5 \times 5 \times 10$ to about $10 \times 10 \times 35$ mm$^3$.

4. The method of claim 1 wherein said ionizing radiation is selected from the group consisting of gamma radiation and x-ray radiation.

5. The method of claim 5 wherein said ionizing radiation is gamma radiation and said source is cobalt-60.

6. A method for producing a semiconductor crystal which is highly transparent in the 1–3 $\mu$ spectral range, comprising the steps of:
   (a) providing a crystal of semiconductor material comprising an element selected from the group consisting of phosphorus and arsenic; and
   (b) exposing said crystal to high energy ionizing radiation to produce within the crystal energetic photo electrons whereby said energetic photoelectrons produce defect donors to cancel acceptors existing in said crystal.

7. The method of claim 6 wherein said semiconductor crystal comprises a material selected from the group consisting of AnGeP$_2$, CdGeAs$_2$, ZnGeAs$_x$P$_{1-x}$, CdGeAs$_x$P$_{1-x}$, ZnGeAs$_2$, ZnSiAs$_2$, ZnSiP$_2$, CdGeP$_2$, CdSiP$_2$, ZnSiAs$_x$P$_{1-x}$, CdSiAs$_x$P$_{1-x}$, and CdSnP$_2$.

8. The method of claim 6 wherein said crystal is in the size range of about $5 \times 5 \times 10$ to about $10 \times 10 \times 35$ mm$^3$.

9. The method of claim 6 wherein said ionizing radiation is selected from the group consisting of gamma radiation and x-ray radiation.

10. The method of claim 9 wherein said ionizing radiation is gamma radiation and said source is cobalt-60.

* * * * *

UNITED STATES PATENT AND TRADEMARK OFFICE
CERTIFICATE OF CORRECTION

PATENT NO. : 5,259,917

DATED : November 9, 1993

INVENTOR(S) : Melvin C. Ohmer

It is certified that error appears in the above-identified patent and that said Letters Patent is hereby corrected as shown below:

Column 2, line 13, "106" should be -- $10^6$ --.

Column 4, line 18, "AnSiP$_2$" should be -- ZnSiP$_2$".

Column 4, line 41, "AnGeP$_2$" should be --ZnGeP$_2$".

Signed and Sealed this

Thirty-first Day of May, 1994

Attest:

BRUCE LEHMAN

Attesting Officer    Commissioner of Patents and Trademarks